United States Patent
Kulkarni et al.

(10) Patent No.: US 10,014,767 B2
(45) Date of Patent: Jul. 3, 2018

(54) BI-DIRECTIONAL MULTI-MODE CHARGE PUMP

(71) Applicant: Intel Corporation, Santa Clara, CA (US)

(72) Inventors: Jaydeep Kulkarni, Portland, OR (US); Yong Shim, West Lafayette, IN (US); Pascal A. Meinerzhagen, Lausanne (CH); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/081,445

(22) Filed: Mar. 25, 2016

(65) Prior Publication Data

US 2017/0279348 A1 Sep. 28, 2017

(51) Int. Cl.
*G05F 1/10* (2006.01)
*H02M 3/07* (2006.01)
*H03K 3/03* (2006.01)
*H03K 5/19* (2006.01)

(52) U.S. Cl.
CPC ............ *H02M 3/07* (2013.01); *H03K 3/0315* (2013.01); *H03K 5/19* (2013.01)

(58) Field of Classification Search
CPC ....... H02M 3/07; H02M 3/073; H03L 7/0895; H03L 7/0812
See application file for complete search history.

(56) References Cited

U.S. PATENT DOCUMENTS

| | | | | |
|---|---|---|---|---|
| 5,874,849 A | * | 2/1999 | Marotta | H02M 3/073 307/110 |
| 6,064,582 A | * | 5/2000 | Luchner | H02M 3/07 307/110 |
| 2005/0007187 A1 | | 1/2005 | Zhang | |
| 2005/0258891 A1 | * | 11/2005 | Ito | H02M 3/07 327/538 |
| 2008/0042731 A1 | | 2/2008 | Daga et al. | |
| 2008/0122506 A1 | * | 5/2008 | Racape | G11C 16/30 327/157 |
| 2009/0116158 A1 | * | 5/2009 | Graves | H02H 3/20 361/86 |

(Continued)

FOREIGN PATENT DOCUMENTS

WO WO-2015094374 A1 6/2015
WO WO-2017165050 A1 9/2017

OTHER PUBLICATIONS

Jung, Wanyeong, et al., "A 3nW Fully Integrated Energy Harvester Based on Self-Oscillating Switched-Capacitor DC-DC Converter", ISSCC 2014 / Session 23 / Energy Harvesting / 23.3, (Feb. 12, 2014), 3 pgs.

(Continued)

*Primary Examiner* — Sibin Chen
(74) *Attorney, Agent, or Firm* — Schwegman Lundberg & Woessner, P.A.

(57) ABSTRACT

Some embodiments include apparatus and methods using a charge pump coupled to a first supply power node and a second supply power node. The charge pump is arranged to transfer charge from the first supply power node to the second supply power node during a first time interval and to transfer charge from the second supply power node to the first supply power node during a second time interval.

8 Claims, 15 Drawing Sheets

(56) References Cited

U.S. PATENT DOCUMENTS

| | | | |
|---|---|---|---|
| 2009/0322431 A1 | 12/2009 | Cao et al. | |
| 2010/0033232 A1* | 2/2010 | Pan | H02M 3/07 |
| | | | 327/536 |
| 2012/0139522 A1* | 6/2012 | Hasegawa | B60L 11/1887 |
| | | | 323/311 |
| 2012/0169409 A1 | 7/2012 | Ker | |
| 2012/0206150 A1* | 8/2012 | Holzer | H03G 1/0088 |
| | | | 324/537 |
| 2015/0162825 A1 | 6/2015 | Huynh et al. | |
| 2016/0301204 A1* | 10/2016 | Niehoff | H02H 3/24 |

OTHER PUBLICATIONS

"International Application Serial No. PCT/US2017/018859, International Search Report dated Jul. 28, 2017", 4 pgs.
"International Application Serial No. PCT/US2017/018859, Invitation to Pay Additional Fees and Partial Search Report dated May 22, 2017", 7 pgs.
"International Application Serial No. PCT/US2017/018859, Written Opinion dated Jul. 28, 2017", 10 pgs.

* cited by examiner

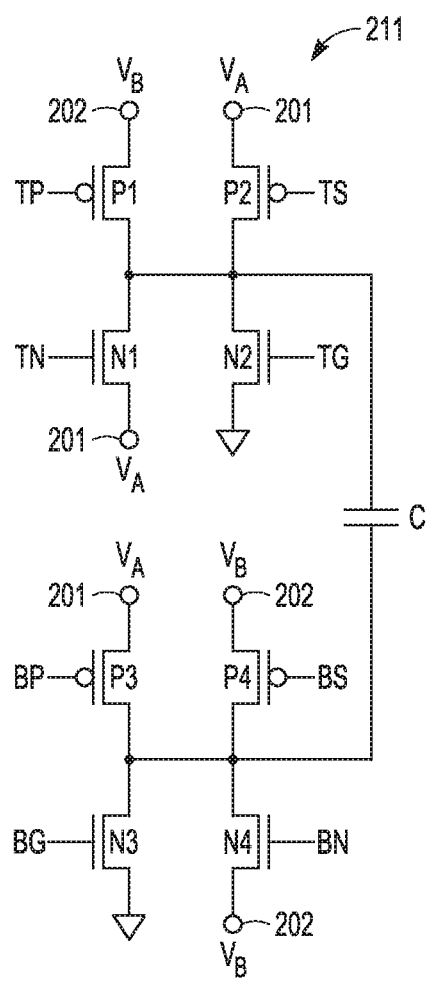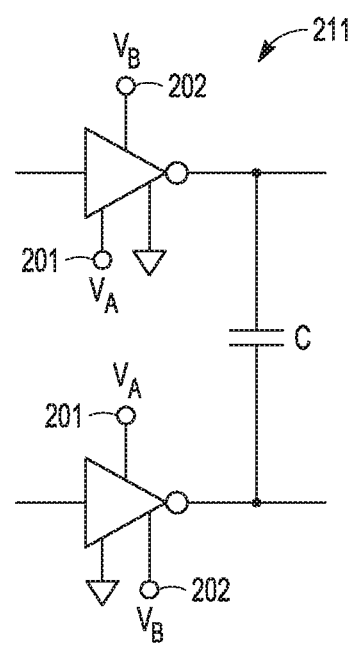
FIG. 2A
FIG. 2B

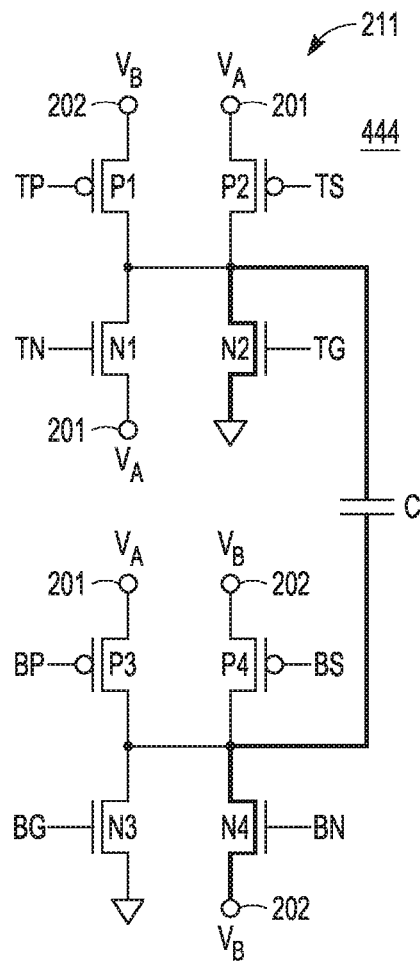
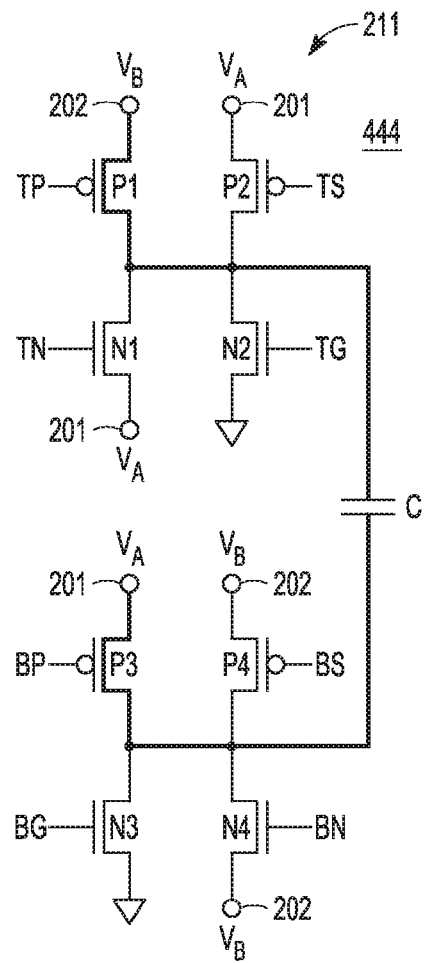
FIG. 4A          FIG. 4B
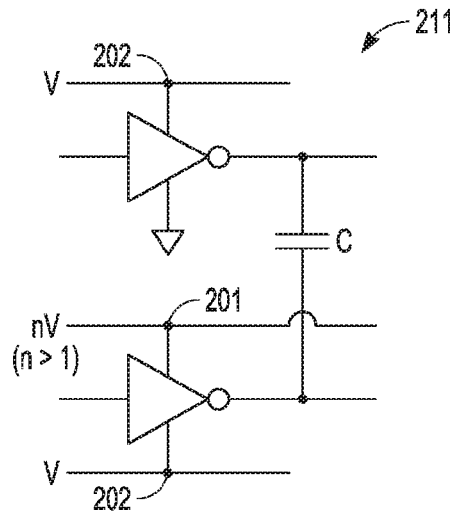
FIG. 4C

BI-DIRECTIONAL MULTI-MODE CHARGE PUMP

TECHNICAL FIELD

Embodiments described herein pertain to supply power in integrated circuits. Some embodiments relate to charge pump circuitry.

BACKGROUND

Charge pump circuits are commonly used electronic devices to generate a higher supply voltage from a lower supply voltage. Some conventional charge pumps operate to transfer charge in only one direction. The unidirectional operation make these charge pumps inapplicable for some device applications.

BRIEF DESCRIPTION OF THE DRAWINGS

FIG. 2A shows a bi-directional voltage booster circuit including interchangeable input and output, according to some embodiments described herein.

FIG. 2B shows an equivalent circuit diagram of the voltage booster circuit of FIG. 2A, according to some embodiments described herein.

FIGS. 4A-4C show the voltage booster circuit of FIG. 2A arranged to operate in another state, according to some embodiments described herein.

DETAILED DESCRIPTION

The techniques described herein include a bi-directional charge pump. The described charge pump can operate in different modes and can transfer charge between different supply power nodes in both directions at different times. The bi-directional charge pump helps avoid using either multiple unidirectional charge pumps or a combination of a unidirectional charge pump and large multiplexing circuitry. In comparison with some conventional charge pump techniques, the bi-directional charge pump may occupy a relatively smaller area and may be easier to control. The bi-directional and multi-mode operations of the charge pump described herein may improve energy efficiency in the device or system that includes the charge pump. Other improvements and benefits of the bi-directional charge pump are described below.

Figure 1A:
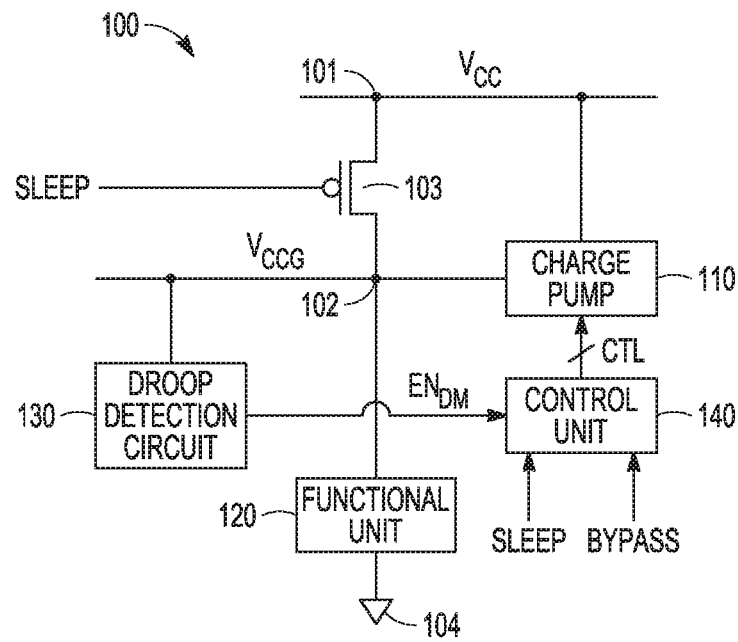
FIG. 1A shows an apparatus including a bi-directional charge pump, according to some embodiments described herein.

FIG. 1A shows an apparatus 100 including a charge pump 110, according to some embodiments described herein. Apparatus 100 can include or be included in an electronic device or systems. Examples of such devices or systems include computers (e.g., servers, desktops, laptops, and notebooks), tablets, cellular phones, wearable electronic things, and other electronic devices or systems.

In FIG. 1A, apparatus 100 can include a supply power node 101 to receive a voltage $V_{CC}$ and a supply power node 102 to provide a voltage (e.g., gated voltage) $V_{CCG}$. Supply power node 101 can be part of a supply power rail (e.g., $V_{CC}$ power rail) of apparatus 100 that can receive supply power from a battery (not shown) through a power path coupled to the battery. Such a power path may include a voltage regulator to receive power from the battery and generate a regulated voltage, which can include voltage $V_{CC}$. Thus, voltage $V_{CC}$ can be a regulated supply voltage.

Supply power node 102 can be part of another supply power rail (e.g., $V_{CCG}$ power rail) to provide voltage $V_{CCG}$, which can also be a regulated supply voltage $V_{CCG}$ based on voltage $V_{CC}$. The value of voltage $V_{CCG}$ can be greater than the value of voltage $V_{CC}$ after charge pump 110 operates to transfer (e.g., pump) charge from supply power node 101 to supply power node 102 through a circuit path in charge pump 110. Voltage $V_{CC}$, voltage $V_{CCG}$, or both can be shared by different components of apparatus 100.

Apparatus 100 can include a transistor 103, which has terminals (e.g., source and drain terminals) coupled (e.g., directly coupled) to supply power nodes 101 and 102, and a gate to receive a signal SLEEP. Transistor 103 can be controlled (e.g., turned on or turned off) by signal SLEEP to operate as a power gate transistor. Transistor 103 can be turned on to form a circuit path (e.g., current path) between supply power nodes 101 and 102 through transistor 103. Transistor 103 can be turned off to decouple supply power node 102 from supply power node 101. FIG. 1A shows an example where transistor 103 is a p-channel metal-oxide semiconductor (PMOS) transistor. Other types of transistors can be used.

Charge pump 110 is a bi-directional charge pump that has a bi-directional operation. Charge pump 110 can be arranged (e.g., configured) to transfer charge in one direction during a time interval and transfer charge in another direction during another time interval. For example, charge pump 110 can transfer charge from supply power node 101 to supply power node 102 if it operates in one mode during a time interval, and transfer charge from supply power node 102 to supply power node 101 if it operates in another mode during another time interval.

Apparatus 100 can include a functional unit 120 coupled to node 101 and a node 104 (e.g., ground or $V_{SS}$). Functional unit 120 can include or can be part of a central processing unit (CPU), a memory array, or other types of functional units. Functional unit 120 can use voltage $V_{CCG}$ as its supply voltage for its operations. Functional unit 120 may have different operational states that may include a higher power consumption state (e.g., active state) and a lower power consumption state (e.g., an inactive state, such as a sleep state). In the higher power consumption state, functional unit 120 may actively perform its operations (e.g., processing information, decoding instructions, storing information (e.g., data) in memory cells (e.g., memory array), retrieving information from memory cells, or other operations). In a lower power consumption state, functional unit 120 may be inactive or may be idling. Power consumed by functional unit 120 in a higher power consumption state is higher than power consumed by functional unit 120 in a lower power consumption state. In order to save power, supply power node 102 can be decoupled from supply power node 101 when functional unit 120 enters the lower power consumption state.

Apparatus 100 can include a droop detection circuit 130, which can operate to detect (e.g., monitor) changes in the value of voltage $V_{CCG}$ at supply power node 102. For example, droop detection circuit 130 can detect whether the value of voltage $V_{CCG}$ changes from a value (e.g., a voltage value corresponding to a voltage level 117 shown in FIG. 1C) to another value (e.g., a voltage value corresponding to a voltage level 116 shown in FIG. 1C, which is lower than voltage level 117).

Apparatus 100 can include a control unit 140. Control unit 140 can provide signals (e.g., control signals) CTL to cause charge pump 110 to operate in different modes based on the value of signals CTL. The value of signals CTL can be based on the values of signals SLEEP, BYPASS, and $EN_{DM}$ (e.g., enable droop mitigation signal) received by control unit 140. Each of signals SLEEP, BYPASS, and $EN_{DM}$ can be activated (e.g., change from one level to another level) based on an occurrence of an event in apparatus 100. Depending on which of signals SLEEP, BYPASS, and $EN_{DM}$ is activated, control unit 140 can provide signals CTL with appropriate (e.g., predetermined) values in order to cause charge pump 110 to operate in different modes. FIG. 1A shows control unit 140 as separate from charge pump 110 as an example. A portion of control unit 140 or the entire control unit 140 can be part of (e.g., inside) charge pump 110.

Figure 1B:
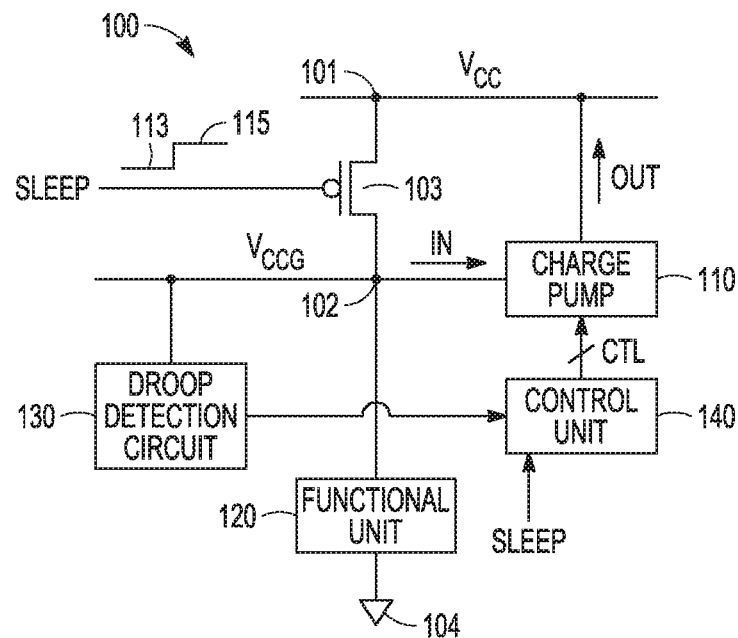
FIG. 1B shows the charge pump of FIG. 1A during a charge recovery mode, according to some embodiments described herein.

FIG. 1B shows charge pump 110 during a charge recovery mode where charge pump 110 transfers charge in a direction from supply power node 102 to supply power node 101 through charge pump 110, according to some embodiments described herein. In the charge recovery mode, charge pump 110 can operate as a charge recovery pump to recover charge that may otherwise be wasted. As shown in FIG. 1B, signal SLEEP can change from a level 113 to a level 115. This change can indicate that functional unit 120 enters a lower power consumption state (e.g., a sleep state) from another state (e.g., from a higher power consumption state). Upon functional unit 120 entering the lower power consumption state, transistor 103 can be turned off. Charge stored at supply power node 102 (e.g., on $V_{CCG}$ power rail) may slowly move to node 104 through a path (e.g., leakage path) in functional unit 120. In order to improve energy efficiency in apparatus 100, charge pump 110 can operate to transfer (e.g., recycle) charge from supply power node 102 to supply power node 101 in a direction from IN to OUT, as shown in FIG. 1B. Thus, in the charge recovery mode, the direction of the charge flow is from supply power node 102 to supply power node 101 through charge pump 110.

Figure 1C:
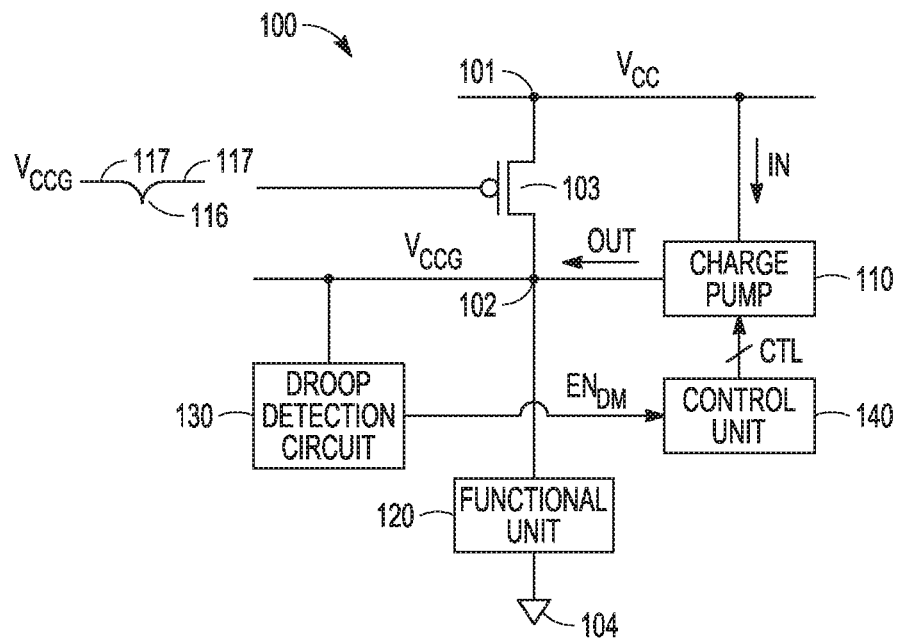
FIG. 1C shows the charge pump of FIG. 1A during a droop mitigation mode, according to some embodiments described herein.

FIG. 1C shows charge pump 110 during a droop mitigation mode where charge pump 110 transfers charge in a direction from supply power node 101 to supply power node 102 through charge pump 110, according to some embodiments described herein. In the droop mitigation mode, charge pump 110 can operate to mitigate a voltage droop at supply power node 102. As shown in FIG. 1C, a voltage droop may occur when the value of voltage $V_{CCG}$ unexpectedly changes from a value corresponding to a voltage level 117 to another value (e.g., a lower value) corresponding to a voltage level 116. The droop mitigation mode performed by charge pump 110 allows the value of voltage $V_{CCG}$ to go back to the value corresponding to voltage level 117 (e.g., the level existing before the voltage droop occurs). The voltage droop may happen when functional unit 120, or another component sharing voltage $V_{CCG}$ with functional unit 120, suddenly incurs a large current spike that may lead to a sharp decrease in the value of voltage $V_{CCG}$. This voltage droop can cause malfunction of nearby circuitry (e.g., circuitry that shares voltage $V_{CCG}$ with functional unit 120) by flipping data on the flops (e.g., latches), increasing in combinational gate delay, and hindering operations of the analog circuitry.

Droop detection circuit 130 in FIG. 1C can operate to detect changes (e.g., a decrease) in the value of voltage $V_{CCG}$ at supply power node 102. Based on the detection, droop detection circuit 130 can send signal $EN_{DM}$ to control unit 140 if the voltage droop occurs. Then, control unit 140 can cause charge pump 110 to enter the droop mitigation mode. In this mode, at the onset of the voltage droop, charge pump 110 can operate to dump enough charge to supply power node 102 to counteract the voltage droop. For example, charge pump 110 can operate to transfer charge in a direction from IN to OUT, as shown in FIG. 1C. Thus, in the droop mitigation mode, the direction of the charge flow is from supply power node 101 to supply power node 102 through charge pump 110.

Figure 1D:
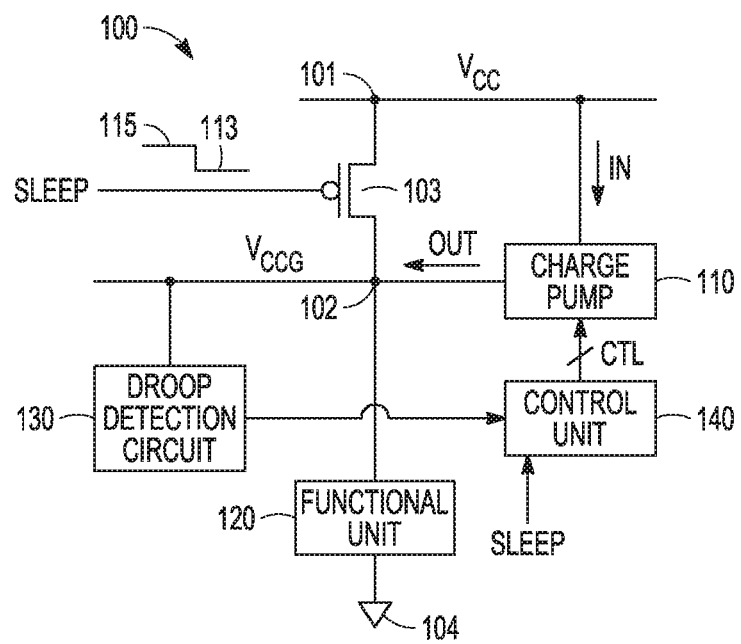
FIG. 1D shows the charge pump of FIG. 1A during a wake-up assist mode, according to some embodiments described herein.

FIG. 1D shows charge pump 110 during a wake-up assist mode where charge pump 110 transfers charge in a direction from supply power node 101 to supply power node 102 through charge pump 110, according to some embodiments described herein. Charge pump 110 may enter a wake-up assist mode when a lower power consumption state (e.g., sleep state) ends and a wake-up state begins. For example, as shown in FIG. 1D, signal SLEEP can change from a level 115 to a level 113. This change can indicate that functional unit 120 exits a lower power consumption state and enters a wake-up state or other active states. The wake-up state can be part of a higher power consumption state. When the lower power consumption state ends, transistor 103 can be turned on. This supplies current from supply power node 101 to supply power node 102 through transistor 103 and charges supply power node 102. Charge pump 110 can operate to expedite the speed of charging of supply power node 102 when the wake-up state begins. For example, charge pump 110 can provide a constant current (fixed quantum of charge/cycle) to supply power node 102 in a direction from IN to OUT, as shown in FIG. 1D. Thus, in the wake-up assist mode, the direction of the charge flow is from supply power node 101 to supply power node 102 through charge pump 110.

Figure 1E:
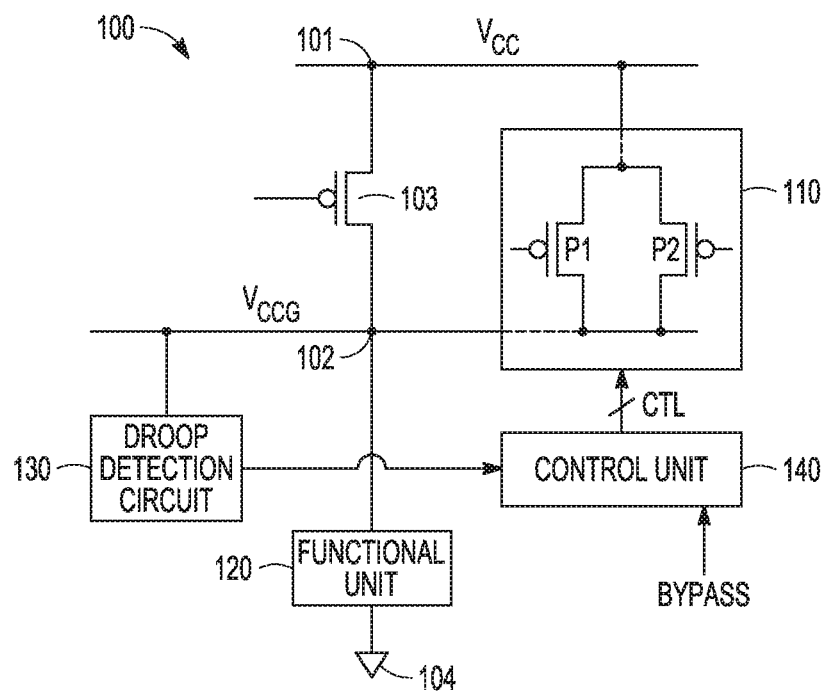
FIG. 1E shows the charge pump of FIG. 1A during a bypass mode, according to some embodiments described herein.

FIG. 1E shows charge pump 110 during a bypass mode, according to some embodiments described herein. In the bypass mode, charge pump operation of charge pump 110 may be disabled, such that charge pump 110 may not operate as a charge pump. Instead, as shown in FIG. 1E, some of the transistors (e.g., transistors P1 and P2) of charge pump 110 can be statically coupled between supply power nodes 101 and 102. In this arrangement, charge pump 110 may operate as a power gate (e.g., a weak power gate transistor) in which transistors P1 and P2 of charge pump 110 are arranged in parallel with transistor 103. In this mode, transistors P1 and P2 are turned on and form an active current path through each of transistors P1 and P2. The direction of the charge flow is from supply power node 101 to supply power node 102 through transistors 103, P1, and P2.

Charge pump 110 (FIG. 1A) can include a number (e.g., odd number) of stages that can be arranged in a series-connected arrangement to form a self-oscillating ring oscillator. Each of the stages can include circuitry arranged to perform bi-directional operations in order to allow charge pump 110 to achieve bi-directional operations in different modes, as described above. Charge pump 110 can include the charge pumps described below with reference to FIG. 2A through FIG. 11.

FIG. 2A shows a bi-directional voltage booster circuit 211 including interchangeable input and output, according to some embodiments described herein. The interchangeable input and output allows voltage booster circuit 211 to be included in the stages of a bi-directional ring oscillator based charge pump, such as the charge pump described below with reference to FIG. 6A and FIG. 9.

As shown in FIG. 2A, voltage booster circuit 211 can include nodes 201 and 202 associated with voltages $V_A$ and $V_B$, respectively; a capacitor C (e.g., flying capacitor); and transistors P1, P2, P3, P4, N1, N2, N3, and N4. Transistors P1, P2, P3, and P4 can include PMOS transistors (e.g., p-type transistors). Transistors N1, N2, N3, and N4 can include n-channel MOS (NMOS) transistors (e.g., n-type transistors). Transistors P1, P2, P3, P4, N1, N2, N3, and N4 can be controlled (turned on or turned off) by signals TP, TS, BP, BS, TN, TG, BG, and BN, respectively.

As shown in FIG. 2A, transistors P1 and N1 can include a shared node (e.g., shared drain region) coupled to one of the plates (e.g., top plate in FIG. 2A) of capacitor C. Transistors P3 and N3 can include a shared node (e.g., shared drain region) coupled to the other plate (e.g., bottom plate in FIG. 2A) of capacitor C. Similarly, transistors P2 and N2 can include a shared node (e.g., shared drain region) coupled to one of the plates (e.g., top plate in FIG. 2A) of capacitor C. Transistors P4 and N4 can include a shared node (e.g., shared drain region) coupled to the other plate (e.g., bottom plate in FIG. 2A) of capacitor C.

FIG. 2B shows an equivalent circuit diagram of voltage booster circuit 211 of FIG. 2A. As shown in FIG. 2B, voltage booster circuit 211 can include two inverters having outputs coupled to respective plates of capacitor C.

Voltage booster circuit 211 has a bi-directional operation, such that nodes 201 and 202 can be used interchangeably as input and output of voltage booster circuit 211 in different states (e.g., different configurations) of voltage booster circuit 211. For example, in one state of voltage booster circuit 211, nodes 201 can be used as an input of voltage booster circuit 211, and nodes 202 can be used as an output of voltage booster circuit 211. In another example, in another state of voltage booster circuit 211, nodes 202 can be used as an input of voltage booster circuit 211, and nodes 201 can be used as an output of voltage booster circuit 211.

Figure 3A:
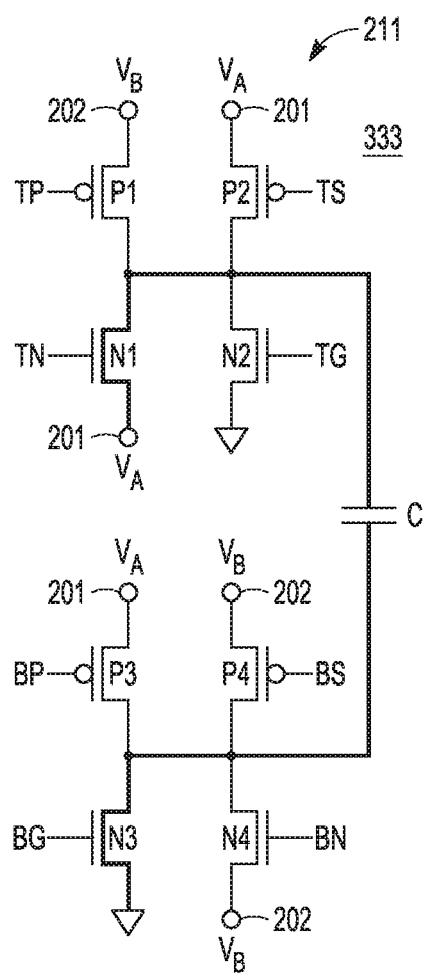
FIGS. 3A-3C show the voltage booster circuit of FIG. 2A arranged to operate in a particular state (e.g., configuration), according to some embodiments described herein.
Figure 3B:
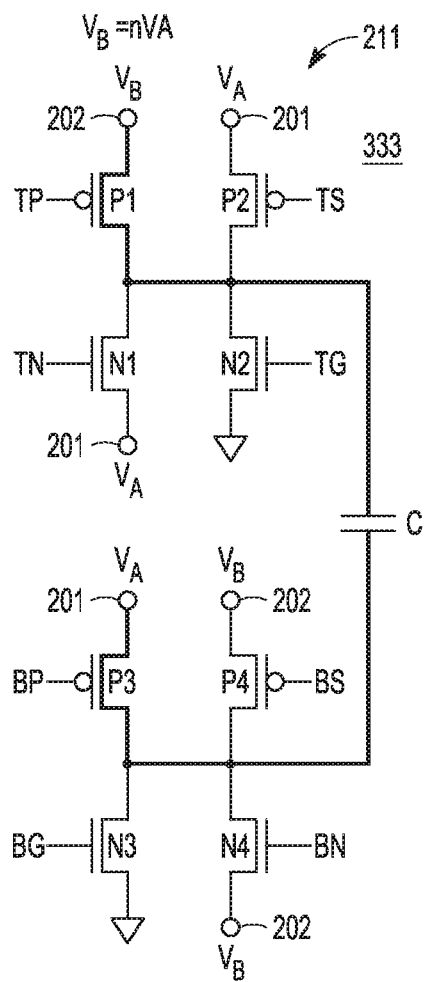

FIG. 3A and FIG. 3B show voltage booster circuit 211 of FIG. 2A arranged (e.g., configured) to operate in a state (e.g., configuration) 333 where nodes 201 are used as input of voltage booster circuit 211, and nodes 202 are used as output of voltage booster circuit 211, according to some embodiments described herein. Thus, in state 333, voltage $V_A$ at nodes 201 can be an input voltage and voltage $V_B$ at nodes 202 can be an output voltage. State 333 has two phases. One phase is shown in FIG. 3A and another phase is shown in FIG. 3B. In state 333, voltage booster circuit 211 operates to transfer charge from nodes 201 to nodes 202, such that the value of voltage $V_B$ is greater than the value of voltage $V_A$.

In FIG. 3A and FIG. 3B, the transistors (N1 and N3) shown in heavier line thickness are active (e.g., turned on) transistors. The transistors (P1, P2, P3, P4, N2 and N4) shown in lighter line thickness are inactive (e.g., turned off) transistors.

Figure 3C:
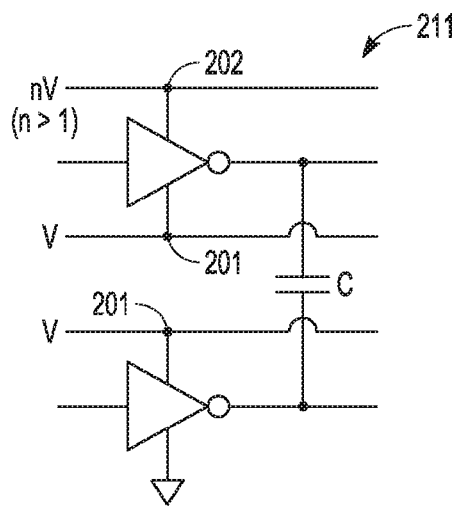

During an operation of the phase of state 333 shown in FIG. 3A, voltage booster circuit 211 can charge capacitor C to a value approximately equal to the value of voltage $V_A$. During an operation of the phase of state 333 shown in FIG. 3B, voltage booster circuit 211 can push the charge from capacitor C to node 202. The value of voltage $V_B$ in state 333 is $V_B=nV_A$, where n>1 (e.g., n can be approximately two, such that $V_B \approx 2V_A$). FIG. 3C shows an equivalent model for voltage booster circuit 211 of FIG. 3B.

Voltage booster circuit 211 can be included in charge pump 110 of FIG. 1A, such that supply power nodes 101 and 102 of FIG. 1A can correspond to nodes 201 and 202, respectively, of FIG. 3A and FIG. 3B. This allows charge pump 110 to use state 333 of voltage booster circuit 211 to operate in one of the modes of charge pump 110, such as the droop mitigation mode (FIG. 1C) or the wake-up assist mode (FIG. 1D).

FIG. 4A and FIG. 4B show voltage booster circuit 211 of FIG. 2A arranged (e.g., configured) to operate in a state (e.g., configuration) 444 where nodes 202 are used as input of voltage booster circuit 211 and nodes 201 are used as output of voltage booster circuit 211, according to some embodiments described herein. State 444 is opposite from state 333 (FIG. 3A and FIG. 3B). For example, in state 444, voltage $V_B$ at nodes 202 can be an input voltage and voltage $V_A$ at nodes 201 can be an output voltage. Similar to state 333, state 444 has two phases. One phase is shown in FIG. 4A and another phase is shown in FIG. 4B. In state 444, voltage booster circuit 211 operates to transfer charge from nodes 202 to nodes 201, such that the value of voltage $V_A$ is greater than the value of voltage $V_B$.

In FIG. 4A and FIG. 4B, the transistors (N2 and N4) shown in heavier line thickness are active (e.g., turned on) transistors. The transistors (P1, P2, P3, P4, N1, and N3) shown in lighter line thickness are inactive (e.g., turned off) transistors.

During an operation of the phase of state 444 shown in FIG. 4A, voltage booster circuit 211 can charge capacitor C to a value approximately equal to the value of voltage $V_B$. During an operation of the phase of state 444 shown in FIG. 4B, voltage booster circuit 211 can push the charge from capacitor C to node 201. The value of voltage $V_A$ in state 444 is $V_A=nV_B$, where n>1 (e.g., n can be approximately two, such that $V_A \approx 2V_B$). FIG. 4C shows an equivalent model for voltage booster circuit 211 of FIG. 4B.

Voltage booster circuit 211 can be included in charge pump 110 of FIG. 1A, such that supply power nodes 101 and 102 of FIG. 1A can correspond to nodes 201 and 202, respectively, of FIG. 4A and FIG. 4B. This allows charge pump 110 to use state 444 of voltage booster circuit 211 to operate in one of the modes of charge pump 110, such as the charge recovery mode (FIG. 1B).

Figure 5:
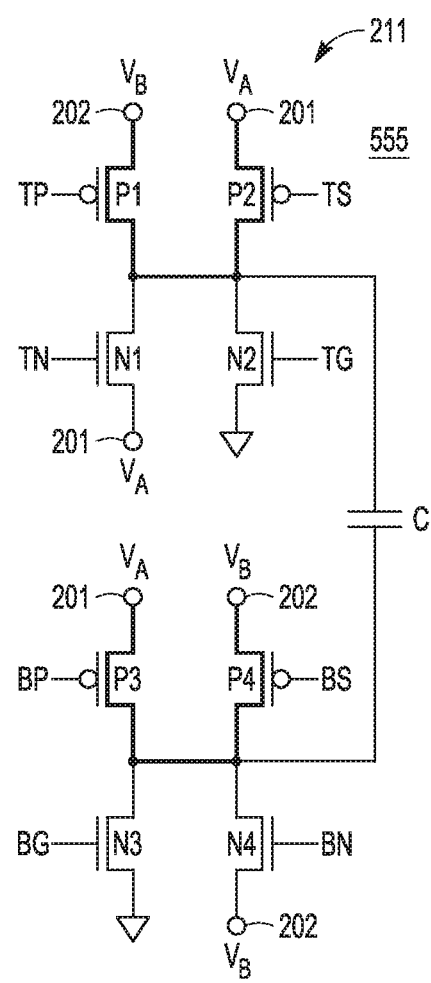
FIG. 5 shows the voltage booster circuit of FIG. 2A arranged to operate in another state, according to some embodiments described herein.

FIG. 5 shows voltage booster circuit 211 of FIG. 2A arranged (e.g., configured) to operate in a state (e.g., configuration) 555, according to some embodiments described herein. As shown in FIG. 5, in state 555, voltage booster circuit 211 includes inactive transistors N1, N2, N3, and N4, and active transistors P1, P2, P3, and P4. Voltage booster circuit 211 can be included in charge pump 110 of FIG. 1A, such that supply power nodes 101 and 102 of FIG. 1A can correspond to nodes 201 and 202, respectively, of FIG. 5. In charge pump 210, transistors P1, P2, P3, and P4 of voltage booster circuit 211 in state 555 (FIG. 5) can be arranged in parallel with transistor 103 (FIG. 1A) between supply power nodes 101 and 102. In this arrangement, transistor P1 can form an active current path between supply power nodes 101 and 102 through transistor P1. Similarly, each of transistors P2, P3, and P4 can also form an active current path between supply power nodes 101 and 102. State 555 of voltage booster circuit 211 allows charge pump 110 to use voltage booster circuit 211 to operate in one of the modes of charge pump 110, such as the bypass mode (FIG. 1E).

Thus, as described above with reference to FIG. 2A through FIG. 5, voltage booster circuit 211 can be arranged to operate in different states at different time intervals. For example, voltage booster circuit 211 can be arranged to operate in state 333 (FIG. 3A and FIG. 3B) during one time interval, in state 444 (FIG. 4A and FIG. 4B) during another time interval, and in state 555 (FIG. 5) during another time interval. Voltage booster circuit 211 can be arranged to transfer charge in different directions in different states. For example, voltage booster circuit 211 can transfer charge from nodes 201 to nodes 202 in state 333 during one time interval, and transfer charge from nodes 202 to nodes 201 in state 444 during another time interval. Operating in different states to transfer charge in different directions allows voltage booster circuit 211 to be included in the stages of charge pump 110 (FIG. 1A) or in a bi-directional ring oscillator based charge pump described below.

Figure 6A:
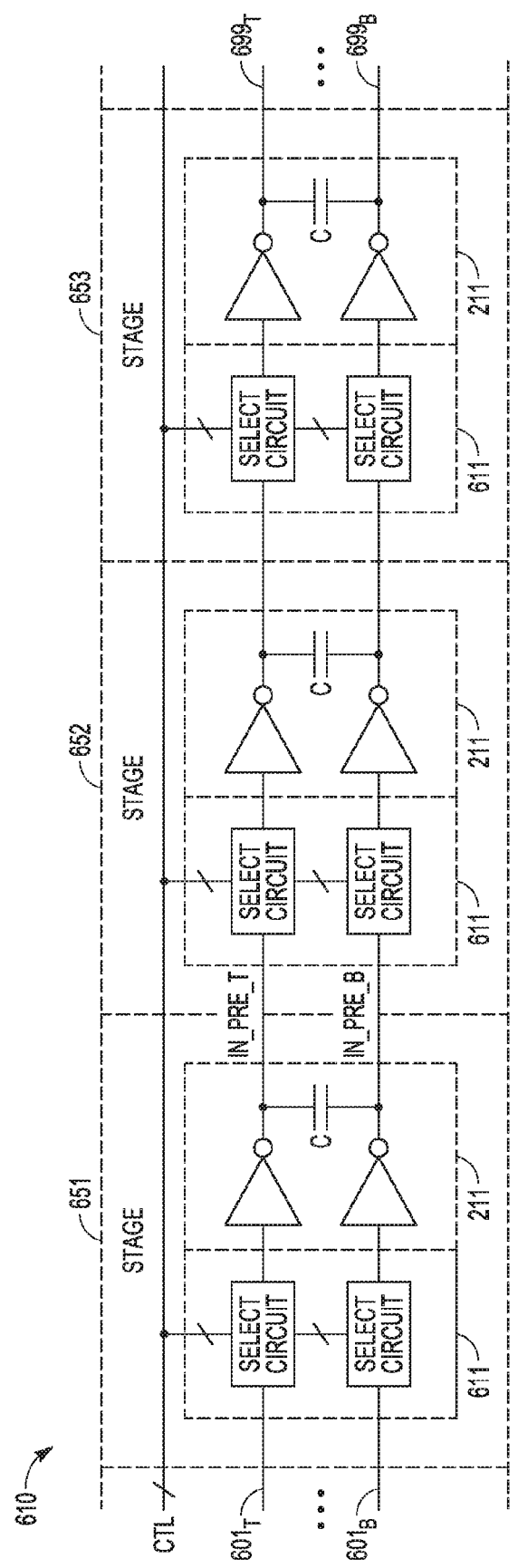
FIG. 6A shows a charge pump including the voltage booster circuit of FIG. 2A in each of the stages of the charge pump, according to some embodiments described herein.

FIG. 6A shows a charge pump 610 including voltage booster circuit 211 in each of stages 651, 652, and 653 of charge pump 610, according to some embodiments described herein. Charge pump 610 can be used as charge pump 110 of FIG. 1A. Voltage booster circuit 211 is the same as voltage booster circuit 211 described above with reference to FIG. 2A through FIG. 5. In FIG. 6A, stages can be part of an odd number of series-connected stages that form a ring oscillator (e.g., self-oscillating ring oscillator) of charge pump 610, in which the output of the last stage of the ring oscillator is coupled (e.g., fed back) to the input of the first stage of the ring oscillator. For example, if the number of stages of the ring oscillator of charge pump 610 is three (e.g., stages 651, 652, and 653), then stage 653 can be the last stage of the ring oscillator and stage 651 can be the first stage of the ring oscillator. In this example, nodes $699_T$ and $699_B$ (e.g., the output) of stage 653 are coupled to nodes $601_T$ and $609_B$ (e.g., the input), respectively, of stage 651. FIG. 6A shows three stages 651, 652, and 653 of charge pump 610 as an example. The number (odd number) of stages of charge pump 610 can vary.

As shown in FIG. 6A, each of stages 651, 652, and 653 can include a select circuit 611 that can be arranged (e.g., configured) to receive signals CTL (which can include separate signals on separate conductive paths). Select circuit 611 can be arranged to provide signals to cause voltage booster circuit 211 to operate in a particular state during a particular time interval, depending on which mode charge pump 610 operates in at that particular time interval. For example, select circuit 611 can cause voltage booster circuit 211 to operate in state 333 (FIG. 3A and FIG. 3B) if charge pump 610 operates in either a droop mitigation mode or a wake-up assist mode. In another example, select circuit 611 can cause voltage booster circuit 211 to operate in state 444 (FIG. 4A and FIG. 4B) if charge pump 610 operates in a charge recover mode. In a particular mode of charge pump 610, select circuits 611 in stages 651, 652, and 653 receive the same signals CTL, such that voltage booster circuits 211 in stages 651, 652, and 653 operate in the same state in that particular mode of charge pump 610.

Figure 6B:
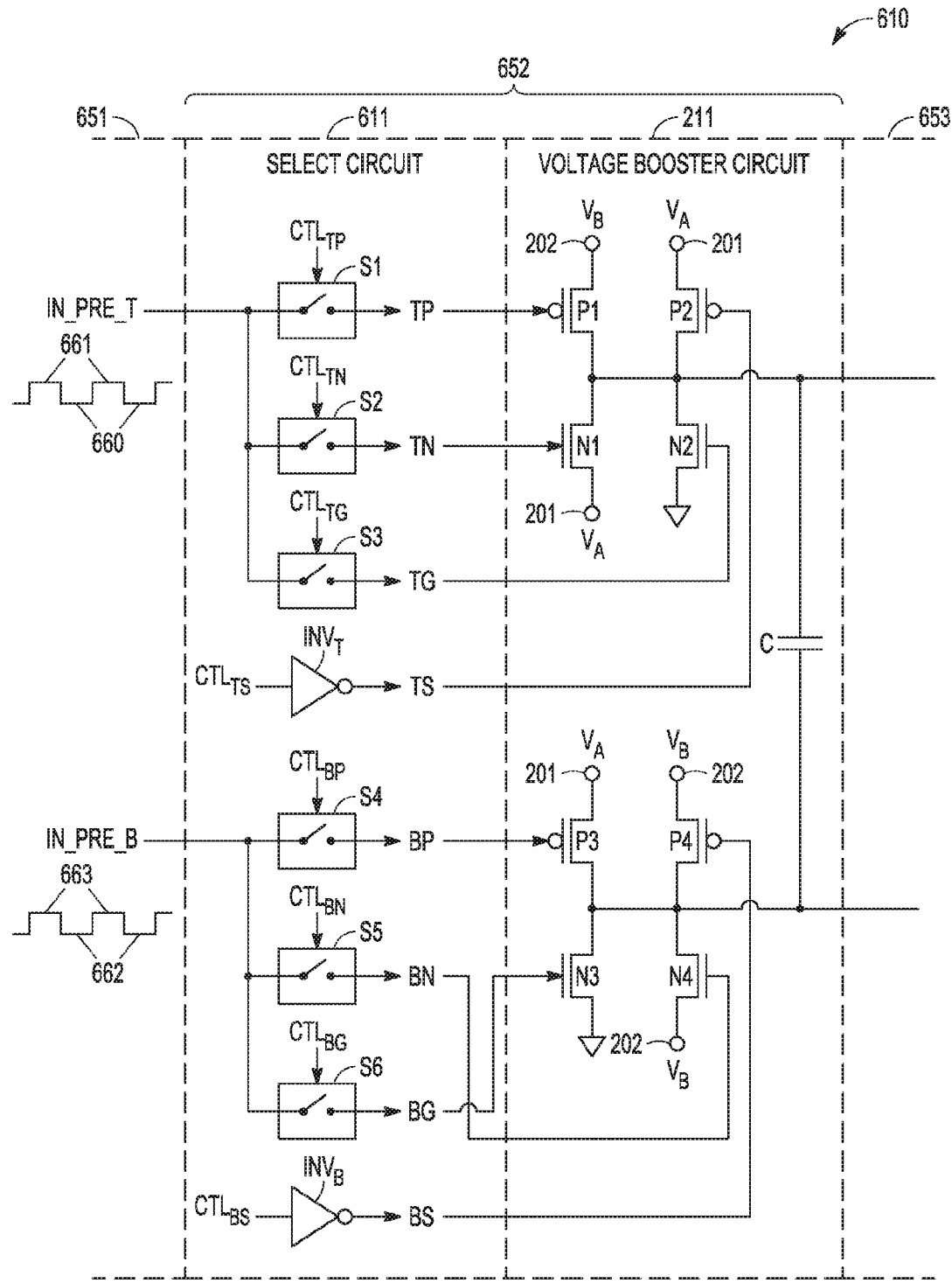
FIG. 6B shows a detailed arrangement of one of the stages of the charge pump of FIG. 6A, according to some embodiments described herein.

FIG. 6B shows a detailed arrangement of stage 652 of charge pump 610 of FIG. 6A. Other stages (e.g., 651 and 653) of charge pump 610 have similar arrangements. As shown in FIG. 6B, select circuit 611 of stage 652 can receive signals IN_PRE_T and IN_PRE_B. Each of stages 651, 652, and 653 receives signals IN_PRE_T and IN_PRE_B from a preceding stage. For example, stage 652 receives signals IN_PRE_T and IN_PRE_B from stage 651. Each of signals IN_PRE_T and IN_PRE_B can oscillate between different levels. For example, signal IN_PRE_T can oscillate between a level 660 (e.g., a level corresponding to logic 0) and a level 661 (e.g., a level corresponding to logic 1). In another example, signal IN_PRE_B can oscillate between a level 662 (e.g., a level corresponding to logic 0) and a level 663 (e.g., a level corresponding to logic 1).

Select circuit 611 can provide signals TP, TN, TG, and TS to control (e.g., turn on or turn off) transistors P1, N1, N2, and P2, respectively, and signals BP, BN, BG, and BS to control transistors P3, N4, N3, and P4, respectively. Select circuit 611 can also receive signals $CTL_{TP}$, $CTL_{TN}$, and $CTL_{TG}$ to control (e.g., turn on or turn off) switches S1, S2, and S3, respectively.

A particular signal among signals TP, TN, and TG can follow (e.g., can be the same as) signal IN_PRE_T if the switch associated with that particular signal is turned on. For example, if switch S1 is turned on, then signal IN_PRE_T passes through switch S1 and becomes signal TP. Similarly, if switches S2 and S3 are turned on, then signal IN_PRE_T passes through switches S1 and S2 and becomes signals TN and TG.

A particular signal among signals TP, TN, and TG can be provided with ground potential (e.g., can be grounded) if the switch associated with that particular signal is turned off. For example, if switch S1 is turned off, then signal TP can be provided with ground potential (e.g., a value corresponding to logic 0). Similarly, if switches S2 and S3 are turned off, then signals TN and TG can be provided with ground potential.

Select circuit 611 can also receive a signal $CTL_{TS}$ to control the level of signal TS at the output of an inverter $INV_T$. Signal TS is an inverted version of the $CTL_{TS}$ signal. For example, if signal $CTL_{TS}$ has a level corresponding to logic 1, then signal TS has a level corresponding to logic 0, and vice versa.

Thus, depending on the values of signals $CTL_{TP}$, $CTL_{TN}$, and $CTL_{TG}$ (that control switches S1, S2, and S3, respectively), some or all of signals TP, TN, and TG can either have the same waveform (e.g., oscillating between levels 660 and 661) as signal IN_PRE_T or be grounded. Depending on the value of signal $CTL_{TS}$, signal TS can have a level corresponding to either logic 1 or logic 0.

Select circuit 611 can provide signals BP, BN, BG, and BS similarly to the way it provides signals TP, TN, TG, and TS. For example, select circuit 611 can receive signals $CTL_{BP}$, $CTL_{BN}$, and $CTL_{BG}$ to control switches S4, S5, and S6, respectively. A particular signal among signals BP, BN, and BG can follow (e.g., can be the same as) signal IN_PRE_B if the switch associated with that particular signal is turned on. For example, if switch S4 is turned on, then signal IN_PRE_B passes through switch S4 and becomes signal BP. Similarly, if switches S5 and S6 are turned on, then signal IN_PRE_B passes through switches S4 and S5 and becomes signals BN and BG.

A particular signal among signals BP, BN, and BG can be provided with ground potential (e.g., a value corresponding to logic 0) if the switch associated with that particular signal is turned off. For example, if switch S4 is turned off, then signal BP can be provided with ground potential. Similarly, if switches S5 and S6 are turned off, then signals BN and BG can be provided with ground potential.

Select circuit 611 can also receive a signal $CTL_{BS}$ to control the level of signal BS at the output of an inverter $INV_B$. Signal BS is an inverted version of signal $CTL_{BS}$. For example, if signal $CTL_{BS}$ has a level corresponding to logic 1, then signal BS has a level corresponding to logic 0, and vice versa.

Thus, depending on the values of signals $CTL_{BP}$, $CTL_{BN}$, and $CTL_{BG}$ (that control switches S4, S5, and S6, respectively), some or all of signals BP, BN, and BG can either have the same waveform (e.g., oscillating between levels 662 and 663) as signal IN_PRE_B or be grounded. Depending on the value of signal $CTL_{BS}$, signal BS can have a level corresponding to either logic 1 or logic 0.

In a particular state (e.g., state 333), voltage booster circuit 211 can operate in one phase (e.g., phase shown in FIG. 3A) of that particular state when signals IN_PRE_T and IN_PRE_B have one level and operate in another phase of that state (e.g., phase shown in FIG. 3B) when signals IN_PRE_T and IN_PRE_B have another level. Thus, based on the oscillation of signals IN_PRE_T and IN_PRE_B, voltage booster circuit 211 can repeat the phases of its state to allow charge pump 610 to achieve charge pump operation.

Figure 6C:
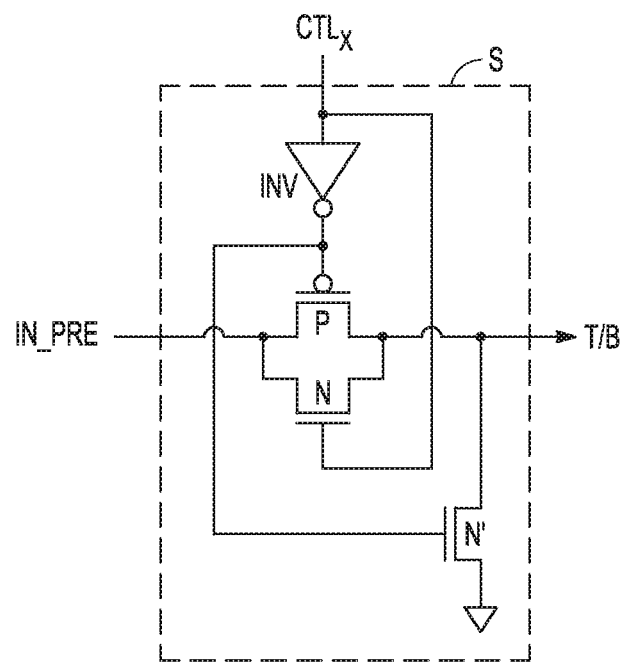
FIG. 6C shows an example switch that can be used for switches of the charge pump in FIG. 6B, according to some embodiments described herein.

FIG. 6C shows an example switch S that can be used for switches S1 through S6 of FIG. 6B, according to some embodiments described herein. As shown in FIG. 6C, switch S can include transistors P, N, and N', and an inverter INV. Transistors P and N can be arranged as a transmission gate. Signal IN_PRE can correspond to signal IN_PRE_T or IN_PRE_B (FIG. 6B). Signal $CTL_X$ can correspond to any of signals $CTL_{TP}$, $CTL_{TN}$, $CTL_{TG}$, $CTL_{BP}$, $CTL_{BN}$, and $CTL_{BG}$ (FIG. 6B). Signal T/B can correspond to any of signals TP, TN, TG, BP, BN, and BG (FIG. 6B).

Signal $CTL_X$ can be provided with different values to turn on or turn off switch S. Switch S is turned on when transistors P and N are turned on and transistor N' is turned off. Switch S is turned off when transistors P and N are turned off and transistor N' is turned on. When switch S is turned on, signal IN_PRE passes through it (through transistors P and N) and becomes signal T/B. When switch S is turned off, signal IN_PRE does not pass through it (does not pass through transistors P and N). When switch S is turned off, signal T/B is provided with ground potential through transistor N' (which is turned on).

FIG. 6C shows an example of switch S that can be used for switches S1 through S6 of FIG. 6B. However, switch S can have other arrangements or circuit elements, as long as signal T/B can be provided with ground potential when switch S is turned off.

Figure 7:
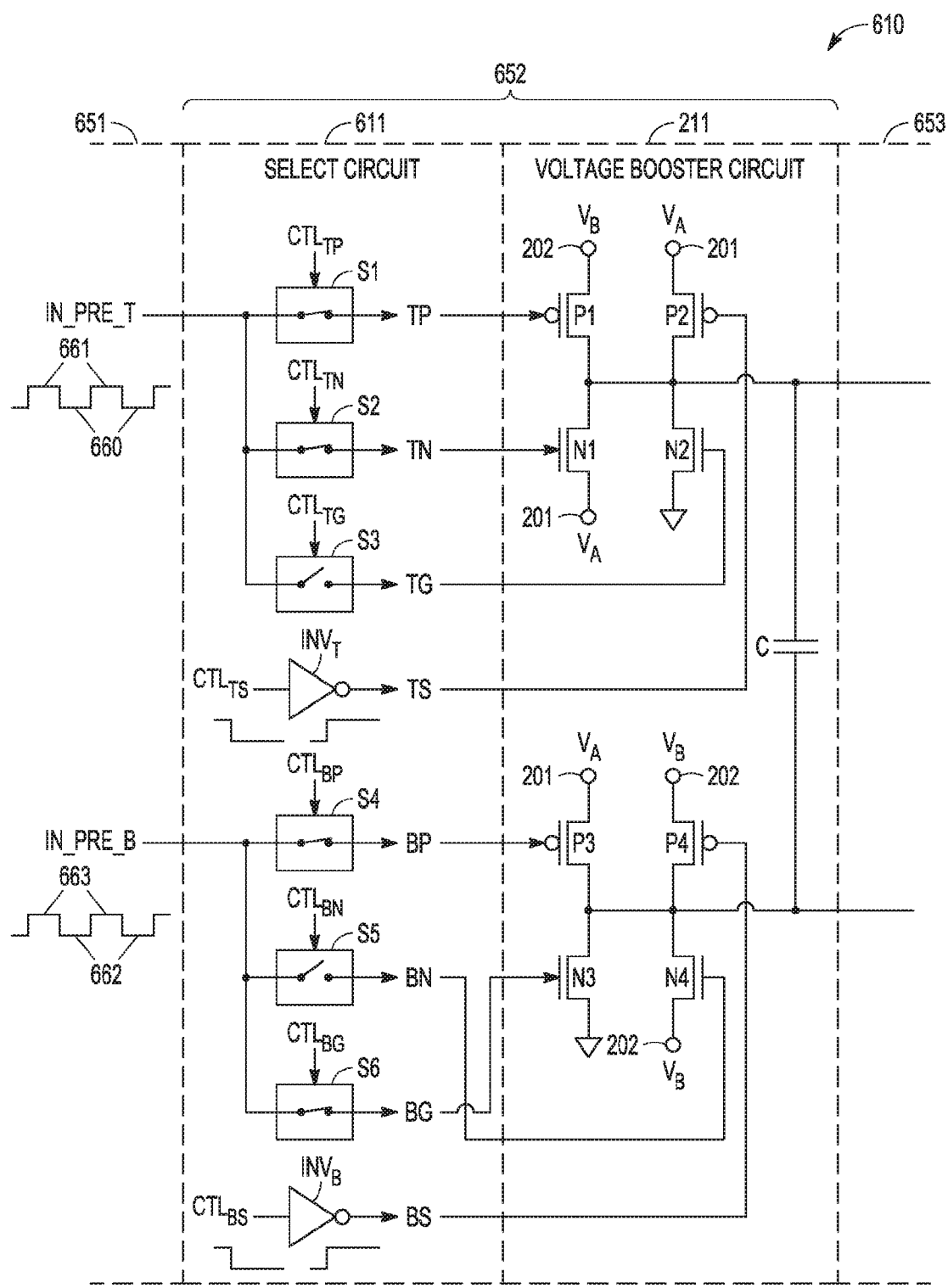
FIG. 7 shows the charge pump of FIG. 6B where a select circuit and a voltage booster circuit are arranged to operate in a particular state, according to some embodiments described herein.

FIG. 7 shows charge pump 610 of FIG. 6B where select circuit 611 and voltage booster circuit 211 are arranged to operate in a state (e.g., state 333 in FIG. 3A and FIG. 3B) to transfer charge from node 201 to node 202, according to some embodiments described herein. In the state of voltage booster circuit 211 in FIG. 7, signals $CTL_{TP}$, $CTL_{TN}$, and $CTL_{TG}$ can be provided with values such that switches S1 and S2 are turned on (e.g., closed), and switch S3 is turned off (e.g., open). Thus, in this state, signal IN_PRE_T passes through switches S1 and S2, such that the values of signals TP and TN follow the values of signal IN_PRE_T. Signal IN_PRE_T does not pass through switch S3. Thus, signal TG can be provided with ground potential. Signal $CTL_{TS}$ can be provided with a value (e.g., logic 0) such that signal TS has a value (e.g., logic 1) to turn off transistor P2.

In the state of voltage booster circuit 211 in FIG. 7, signals $CTL_{BP}$, $CTL_{BN}$, and $CTL_{BG}$ can be provided with values such that switches S4 and S6 are turned on, and switch S5 is turned off. Thus, in this state, signal IN_PRE_B passes through switches S4 and S6, such that the values of signals BP and BG follow the values of signal IN_PRE_B. Signal IN_PRE_B does not pass through switch S5. Thus, signal BN can be provided with ground potential. Signal $CTL_{BS}$ can be provided with a value (e.g., logic 0) such that signal BS has a value (e.g., logic 1) to turn off transistor P4.

The arrangement of select circuit 611 and voltage booster circuit 211 in FIG. 7 allows each of stages 651, 652, and 653 to repeat the phases of the state of voltage booster circuit 211 (e.g., the phases of state 333 in FIG. 3A and FIG. 3B). This allows charge pump 610 to achieve charge pump operation and transfer charge from nodes 201 to nodes 202, such that the value of voltage $V_B$ can be greater than the value of voltage $V_A$ (e.g., $V_B = nV_A$, where n>1). This also allows charge pump 610 to operate in a mode, such as a droop mitigation mode or a wake-up assist mode, as described above with reference to FIG. 1C and FIG. 1D, respectively.

Figure 8:
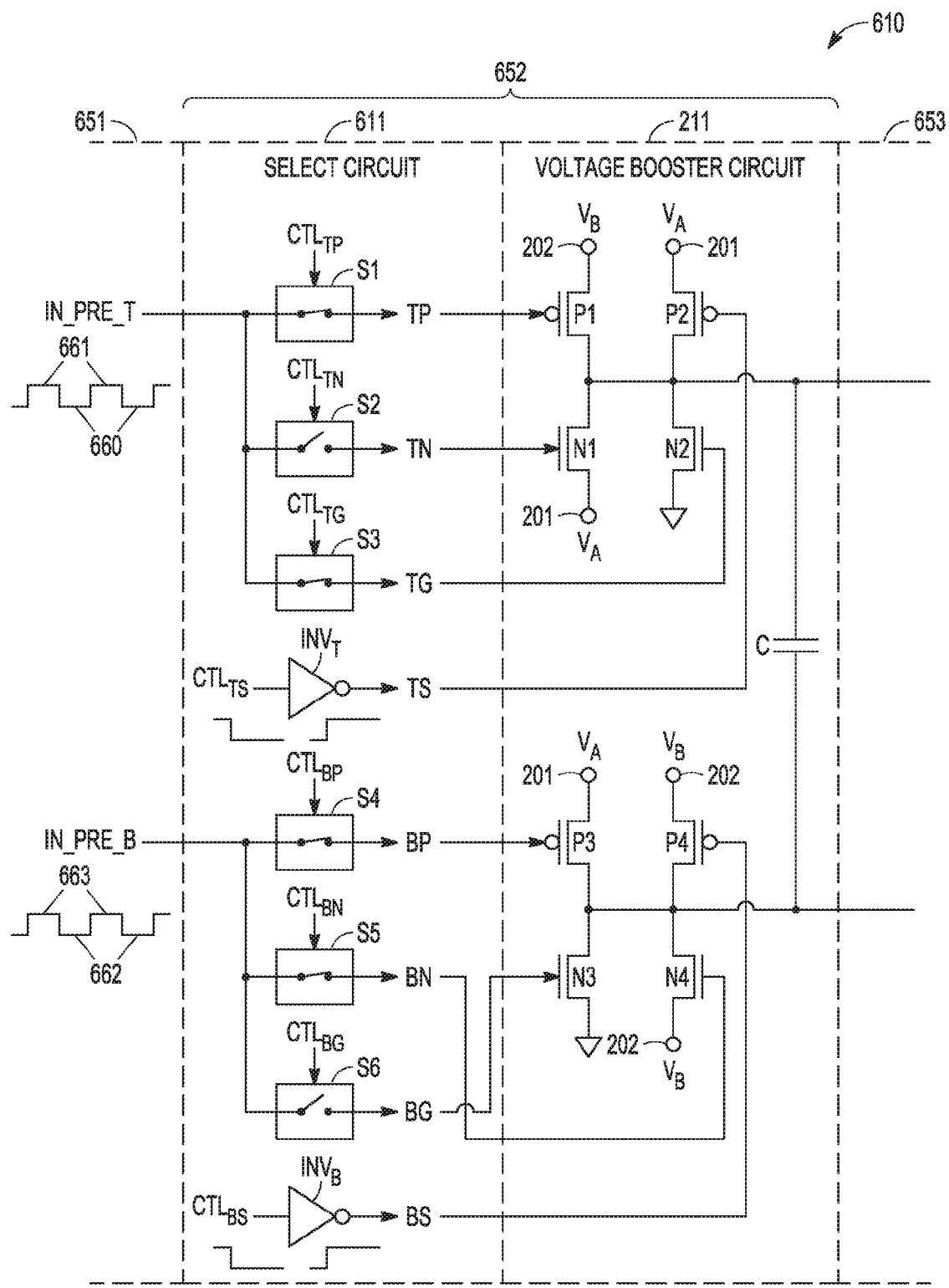
FIG. 8 shows the charge pump of FIG. 6B where the select circuit and the voltage booster circuit are arranged to operate in another state, according to some embodiments described herein.

FIG. 8 shows charge pump 610 of FIG. 6B where select circuit 611 and voltage booster circuit 211 are arranged to operate in a state (e.g., state 444 in FIG. 4A and FIG. 4B) to transfer charge from node 202 to node 201, according to some embodiments described herein. In the state of voltage booster circuit 211 in FIG. 8, signals $CTL_{TP}$, $CTL_{TN}$, and $CTL_{TG}$ can be provided with values such that switches S1 and S3 are turned on, and switch S2 is turned off. Thus, in this state, signal IN_PRE_T passes through switches S1 and S3, such that the values of signals TP and TG follow the values of signal IN_PRE_T. Signal IN_PRE_T does not pass through switch S2. Thus, signal TN can be provided with ground potential. Signal $CTL_{TS}$ can be provided with a value (e.g., logic 0), such that signal TS has a value (e.g., logic 1) to turn off transistor P2.

In the state of voltage booster circuit 211 in FIG. 8, signals $CTL_{BP}$, $CTL_{BN}$, and $CTL_{BG}$ can be provided with values such that switches S4 and S5 are turned on, and switch S6 is turned off. Thus, in this state, signal IN_PRE_B passes through switches S4 and S5, such that the values of signals BP and BN follow the values of signal IN_PRE_B. Signal IN_PRE_B does not pass through switch S6. Thus, signal BG can be provided with ground potential. Signal $CTL_{BS}$ can be provided with a value (e.g., logic 0), such that signal BS has a value (e.g., logic 1) to turn off transistor P4.

The arrangement of select circuit 611 and voltage booster circuit 211 in FIG. 8 allows each of stages 651, 652, and 653 to repeat the phases of the state of voltage booster circuit 211

(e.g., the phases of state 444 in FIG. 4A and FIG. 4B). This allows charge pump 610 to achieve charge pump operation and transfer charge from nodes 202 to nodes 201, such that the value of voltage $V_A$ can be greater than the value of voltage $V_B$ (e.g., $V_A=nV_B$, where n>1). This also allows charge pump 610 to operate in a mode, such as a charge recovery mode, as described above with reference to FIG. 1B FIG. 9 shows charge pump 610 of FIG. 6B where select circuit 611 and voltage booster circuit 211 are arranged to operate in a state (e.g., state 555 in FIG. 5), according to some embodiments described herein. In the state of voltage booster circuit 211 in FIG. 9, signals $CTL_{TP}$, $CTL_{TN}$, and $CTL_{TG}$ can be provided with values such that switches S1, S2, and S3 are turned off. Thus, in this state, signal IN_PRE_T does not pass through switches S1, S2, and S3. Therefore, signals TP, TN, and TG can be provided with ground potential. Signal $CTL_{TS}$ can be provided with a value (e.g., logic 1), such that signal TS has a value (e.g., logic 0) to turn on transistor P2.

Figure 9:
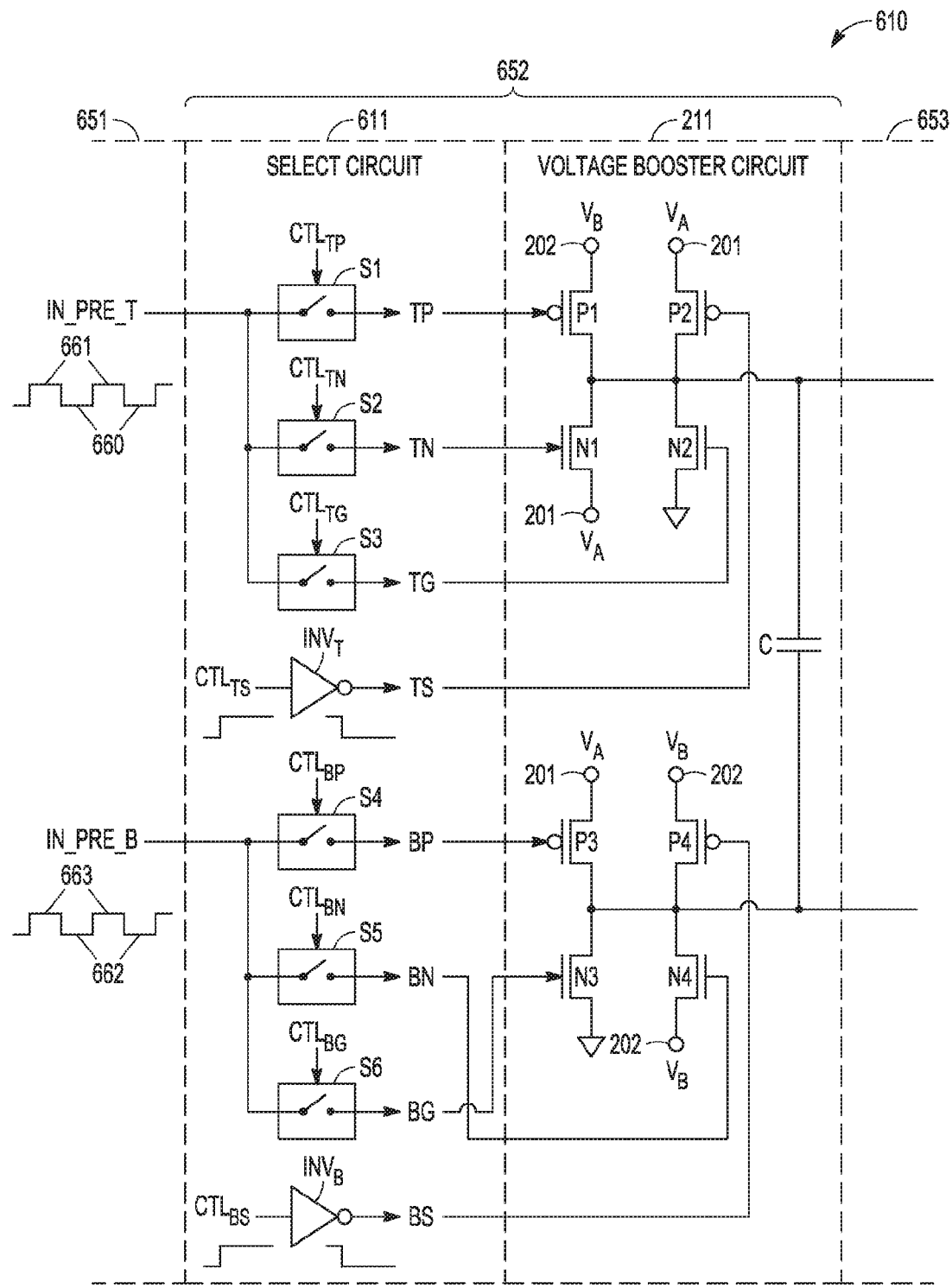
FIG. 9 shows the charge pump of FIG. 6B where the select circuit and the voltage booster circuit are arranged to operate in another state, according to some embodiments described herein.

In the state of voltage booster circuit 211 in FIG. 9, signals $CTL_{BP}$, $CTL_{BN}$, and $CTL_{BG}$ can be provided with values such that switches S4, S5, and S6 are turned off. Thus, in this state, signal IN_PRE_B does not pass through switches S4, S5, and S6. Thus, signals BP, BN, and BG can be provided with ground potential. Signal $CTL_{BS}$ can be provided with a value (e.g., logic 1), such that signal BS has a value (e.g., logic 0) to turn on transistor P4.

The arrangement of select circuit 611 and voltage booster circuit 211 in FIG. 9 causes the charge pump operation of charge pump 610 to be disabled. In this state, charge pump 610 can operate in a mode, such as a bypass mode, as described above with reference to FIG. 1E.

As described above with reference to FIG. 6A through FIG. 9, voltage booster circuit 211 of stages 651, 652, and 653 of charge pump 610 can be arranged to operate in one state during a time interval and in another state during another time interval. This allows charge pump 610 to have bi-directional multi-mode operations. Further, as shown in FIG. 6B through FIG. 9, stages 651, 652, and 653 of charge pump 610 may not use circuitry such as a clock generator, level shifter, and external clock signal to transfer charge between nodes. This may allow charge pump 610 to have a relatively smaller area and to be simpler to control.

Figure 10:
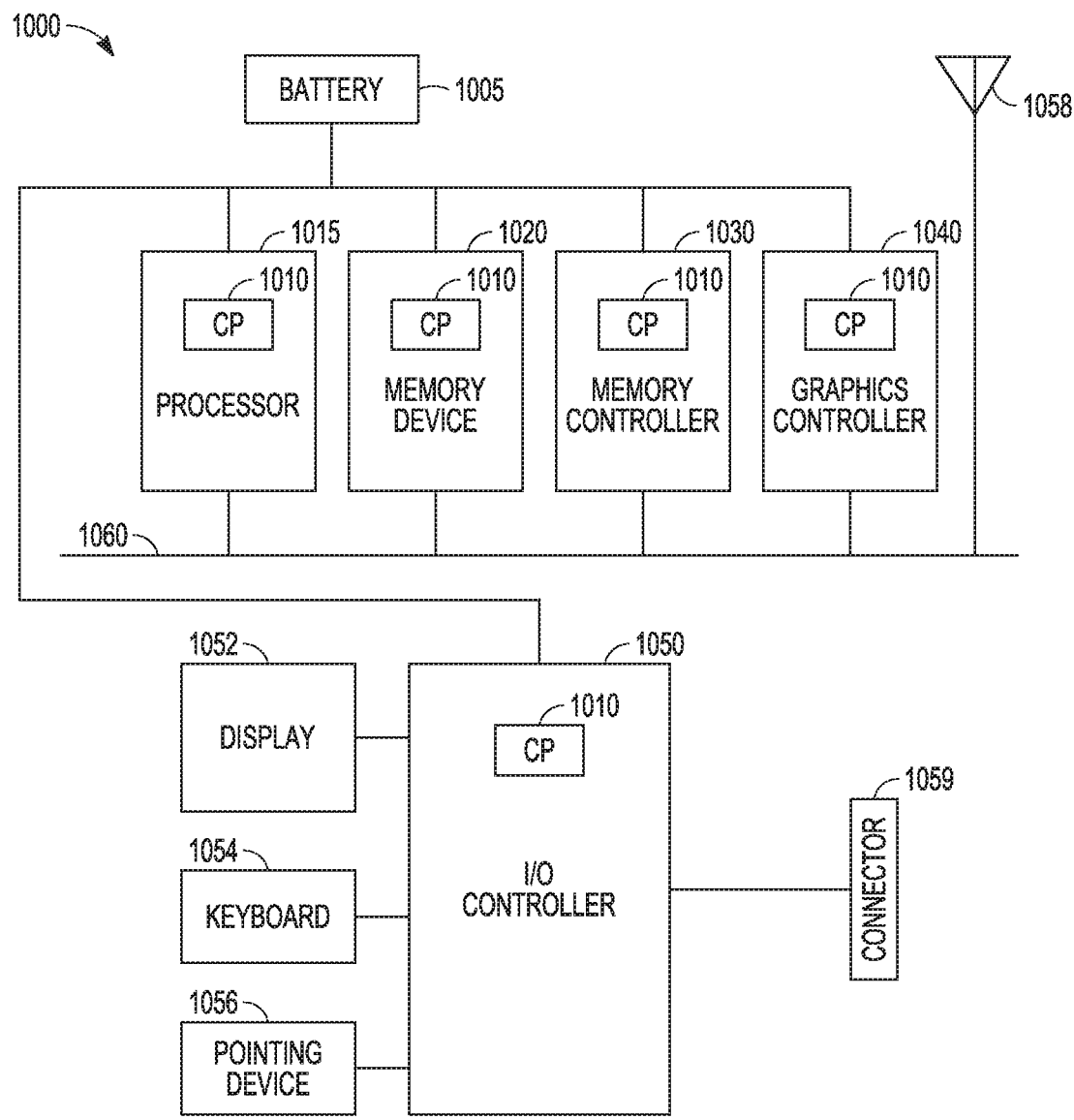
FIG. 10 shows an apparatus in the form of an electronic system, according to some embodiments described herein.

FIG. 10 shows an apparatus in the form of a system (e.g., electronic system) 1000, according to some embodiments described herein. System 1000 can include or be included in a computer, a tablet, or other electronic systems. As shown in FIG. 10, system 1000 can include components such as a battery 1005, a processor 1015, a memory device 1020, a memory controller 1030, a graphics controller 1040, an input and output (I/O) controller 1050, a display 1052, a keyboard 1054, a pointing device 1056, at least one antenna 1058, a connector 1059, and a bus 1060. Bus 1060 can include conductive lines (e.g., metal-based traces on a circuit board where the components of system 1000 are located).

In some arrangements, system 1000 does not have to include a display. Thus, display 1052 can be omitted from system 1000. In some arrangements, system 1000 does not have to include any antenna. Thus, antenna 1058 can be omitted from system 1000.

Battery 1005 can provide power to the components of system 1000, through a power delivery path 1016, such as to processor 1015, memory device 1020, memory controller 1030, graphics controller 1040, and I/O controller 1050.

Processor 1015 can include a general-purpose processor or an application specific integrated circuit (ASIC). Processor 1015 can include a CPU.

Memory device 1020 can include a dynamic random access memory (DRAM) device, a static random access memory (SRAM) device, a flash memory device, a phase change memory device, a combination of these memory devices, or other types of memory. FIG. 10 shows an example where memory device 1020 is a stand-alone memory device separated from processor 1015. In an alternative arrangement, memory device 1020 and processor 1015 can be located on the same die. In such an alternative arrangement, memory device 1020 is an embedded memory in processor 1015, such as embedded DRAM (eDRAM), embedded SRAM (eSRAM), embedded flash memory, or another type of embedded memory.

Display 1052 can include a liquid crystal display (LCD), a touchscreen (e.g., capacitive or resistive touchscreen), or another type of display. Pointing device 1056 can include a mouse, a stylus, or another type of pointing device.

I/O controller 1050 can include a communication module for wired or wireless communication (e.g., communication through one or more antennas 1058). Such wireless communication may include communication in accordance with WiFi communication technique, Long Term Evolution Advanced (LTE-A) communication technique, or other communication techniques.

I/O controller 1050 can also include a module to allow system 1000 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), and other specifications.

Connector 1059 can be arranged (e.g., can include terminals, such as pins) to allow system 1000 to be coupled to an external device (or system). This may allow system 1000 to communicate (e.g., exchange information) with such a device (or system) through connector 1059.

Connector 1059 and at least a portion of bus 1060 can include conductive lines that conform with at least one of USB, DP, HDMI, Thunderbolt, PCIe, and other specifications.

As shown in FIG. 10, each of processor 1015, memory device 1020, memory controller 1030, graphics controller 1040, and I/O controller 1050 can include a charge pump 1010. Charge pump 1010 can include any of the charge pumps described above with reference to FIG. 1A through FIG. 9.

FIG. 10 shows an example where each of processor 1015, memory device 1020, memory controller 1030, graphics controller 1040, and I/O controller 1050 includes charge pump 1010. However, in some arrangements, some of processor 1015, memory device 1020, memory controller 1030, graphics controller 1040, and I/O controller 1050 may not include charge pump 1010.

FIG. 10 shows the components of system 1000 arranged separately from each other as an example. For example, each of processor 1015, memory device 1020, memory controller 1030, graphics controller 1040, and I/O controller 1050 can be located on a separate integrated circuit (IC) (e.g., semiconductor die or an IC chip). In some arrangements, two or more components (e.g., processor 1015, memory device 1020, graphics controller 1040, and I/O controller 1050) of system 1000 can be located on the same die (e.g., same IC chip) that forms a system-on-chip (SoC) or located on the same IC package that forms a system-on-package (SoP) or system-in-package (SiP).

Figure 11:
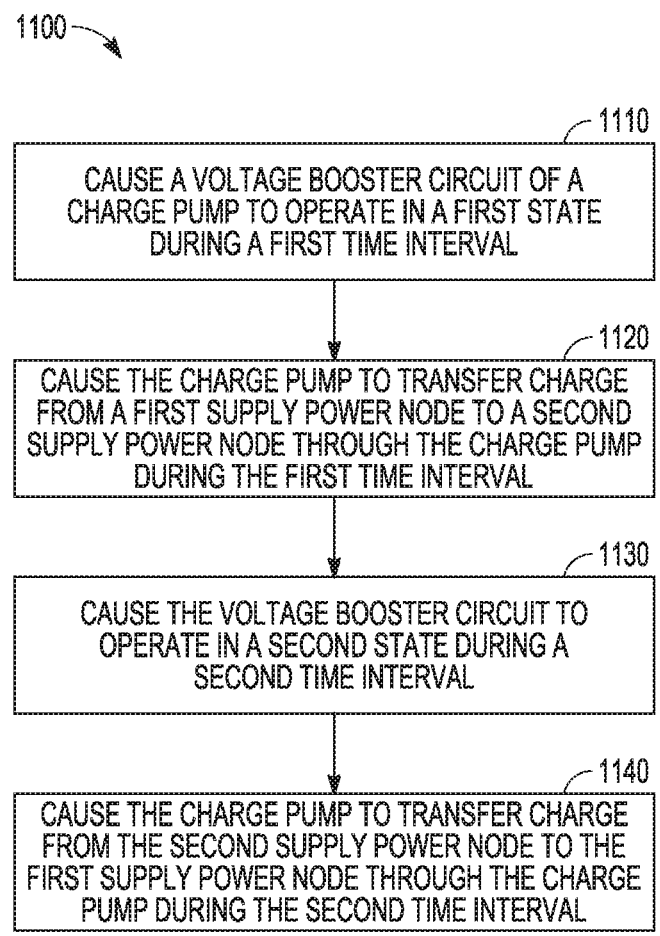
FIG. 11 is a flowchart showing a method of operating an electronic apparatus, according to some embodiments described herein.

FIG. 11 is a flowchart showing a method 1100 of operating an apparatus, according to some embodiments described herein. The apparatus used in method 1100 can include any of the apparatuses (e.g., apparatus 100 and system 1000 including charge pumps 110 and 610) described above with reference to FIG. 1A through FIG. 10. Some of the activities in method 1100 may be performed by hardware, software, firmware, or any combination of hardware, software, and firmware.

As shown in FIG. 11, activity 1110 of method 1100 can include causing a voltage booster circuit of a charge pump to operate in a first state during a first time interval. Activity 1120 of method 1100 can include causing the charge pump to transfer charge from a first supply power node to a second supply power node through the charge pump during the first time interval. Activity 1130 of method 1100 can include causing the voltage booster circuit to operate in a second state during a second time interval. Activity 1140 of method 1100 can include causing the charge pump to transfer charge from the second supply power node to the first supply power node through the charge pump during the second time interval.

Method 1100 can include fewer or more activities relative to activities 1110, 1120, 1130, and 1140 shown in FIG. 11. For example, method 1100 can include activities and operations of any of the apparatuses (e.g., apparatus 100 and system 1000 including charge pumps 110 and 610) described above with reference to FIG. 1A through FIG. 10.

The illustrations of the apparatuses (e.g., apparatus 100 and system 1000 including charge pumps 110 and 610) and methods (e.g., method 1100 and operations of apparatus 100 and system 1000 including operations of charge pumps 110 and 610) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a first supply power node, a second supply power node, and a charge pump coupled to the first and second supply power nodes to transfer charge from the first supply power node to the second supply power node during a first time interval and to transfer charge from the second supply power node to the first supply power node during a second time interval.

In Example 2, the subject matter of Example 1 may optionally include, wherein the second supply power node is arranged to provide a supply voltage to a functional unit, and the charge pump is arranged to transfer charge from the second supply power node to the first supply power node when the functional unit changes from a higher power consumption state to a lower power consumption state.

In Example 3, the subject matter of Example 2 may optionally include, wherein the charge pump is arranged to transfer charge from the first supply power node to the second supply power node when the functional unit exits the lower power consumption state.

In Example 4, the subject matter of Example 1 may optionally include, wherein the second supply power node is arranged to provide a voltage having a first value, and the charge pump is arranged to transfer charge from the first supply power node to the second supply power node if the voltage has a second value less than the first value.

In Example 5, the subject matter of any of Examples 1-4 may optionally include, further comprising a transistor having a first terminal coupled to the first supply power node and a second terminal coupled to the second supply power node.

In Example 6, the subject matter of Example 5 may optionally include, wherein the transistor is arranged to turn on during the first time interval and to turn off during the second time interval.

In Example 7, the subject matter of Example 1 may optionally include, wherein the charge pump includes a transistor to form a circuit path between the first and second supply power nodes when charge pump operation of the charge pump is disabled.

In Example 8, the subject matter of Example 7 may optionally include, further comprising a power gate transistor coupled between the first and second supply power nodes, and wherein the transistor of the charge pump is arranged in parallel with the power gate transistor.

In Example 9, the subject matter of Example 1 may optionally include, wherein the charge pump includes stages arranged to form a ring oscillator, each of the stages being arranged to transfer charge from the first supply power node to the second supply power node during the first time interval and to transfer charge from the second supply power node to the first supply power node during the second time interval.

Example 10 includes subject matter (such as a device, an electronic apparatus (e.g., circuit, electronic system, or both), or a machine) including a capacitor, a first pair of transistors coupled between a first node and a second node, the first pair of transistors including a shared node coupled to a first plate of the capacitor, a second pair of transistors coupled between the first node and ground, the second pair of transistors including a shared node coupled to a second plate of the capacitor, a first additional transistor coupled between the first plate of the capacitor and ground, and a second additional transistor coupled between the second plate of the capacitor and the second node.

In Example 11, the subject matter of Example 10 may optionally include, further comprising a third additional transistor coupled between the first node and the first plate of the capacitor.

In Example 12, the subject matter of Example 11 may optionally include, wherein further comprising a fourth additional transistor coupled between the second node and the second plate of the capacitor.

In Example 13, the subject matter of Example 12 may optionally include, wherein each of the first and second pairs of transistors includes transistors of different types, the first and second additional transistors include transistors of a same type, and the third and fourth additional transistors include transistors of a same type.

In Example 14, the subject matter of any of Examples 10-13 may optionally include, wherein each of the first node and the second node is arranged to provide a voltage during a time interval, and the voltage at the first node during the time interval has a value less than a value of the voltage at the second node during the time interval.

In Example 15, the subject matter of Example 14 may optionally include, wherein each of the first node and the second node is arranged to provide a voltage during an additional time interval, and the voltage at the first node during the additional time interval has a value greater than a value of the voltage at the second node during the additional time interval.

In Example 16, the subject matter of Example 10 may optionally include, wherein the capacitor, the first pair of transistors, the second pair of transistors, and the first and second additional transistors are part of a ring oscillator.

Example 17 includes subject matter (such as a device, an electronic apparatus (e.g., circuit, electronic system, or both), or a machine) including a first stage of a ring oscillator, and a second stage of the ring oscillator coupled to the first stage, each of the stages including a voltage booster circuit coupled to a first node and a second node, and a select circuit to provide signals in order to cause the voltage booster circuit to transfer charge from the first node to the second node during a first state of the voltage booster circuit and to cause the voltage booster circuit to transfer charge from the second node to the first node during a second state of the voltage booster circuit.

In Example 18, the subject matter of Example 17 may optionally include, wherein the select circuit is arranged to provide the signals to control transistors included in the voltage booster circuit, and the signals have first values in the first state of the voltage booster circuit and second values in the second state of the voltage booster circuit.

In Example 19, the subject matter of Example 18 may optionally include, wherein the select circuit includes switches to pass the signals to the voltage booster circuit in order to provide the signals controlling the transistors.

In Example 20, the subject matter of Example 19 may optionally include, wherein a switch among the switches is arranged to turn on during the first state of the voltage booster circuit and turn off during the second state of the voltage booster circuit.

Example 21 includes subject matter (such as a device, an electronic apparatus (e.g., circuit, electronic system, or both), or a machine) including a memory device, and a processor coupled to the memory device, one of the memory device and the processor including a first supply power node, a second supply power node, and a charge pump coupled to the first and second supply power nodes to transfer charge from the first supply power node to the second supply power node during a first time interval and to transfer charge from the second supply power node to the first supply power node during a second time interval.

In Example 22, the subject matter of Example 21 may optionally include, further comprising a display coupled to the processor.

In Example 23, the subject matter of Example 21 or 22 may optionally include, further comprising an antenna coupled the processor.

Example 24 includes subject matter (such as a method of operating a device, an electronic apparatus (e.g., circuit, electronic system, or both), or a machine) including causing a voltage booster circuit of a charge pump to operate in a first state during a first time interval, causing the charge pump to transfer charge from a first supply power node to a second supply power node through the charge pump during the first time interval, causing the voltage booster circuit to operate in a second state during a second time interval, and causing the charge pump to transfer charge from the second supply power node to the first supply power node through the charge pump during the second time interval In Example 25, the subject matter of Example 24 may optionally include, wherein causing the voltage booster circuit of the charge pump to operate in the second state occurs when a functional unit coupled to the second supply power node enters a lower power consumption state from a higher power consumption state.

In Example 26, the subject matter of Example 25 may optionally include, wherein causing the voltage booster circuit of the charge pump to operate in the first state occurs when the functional unit exits the lower power consumption state.

In Example 27, the subject matter of Example 24 may optionally include, wherein causing the voltage booster circuit of the charge pump to operate in the first state is based on a detection of a voltage at the second supply power node changing from a first value to a second value less than the first value.

In Example 28, the subject matter of Example 24 may optionally include, further comprising causing the voltage booster circuit to operate in a third state during a third time interval.

In Example 29, the subject matter of Example 28 may optionally include, wherein arranging transistors of the charge pump in parallel with a power gate transistor coupled between the first and second supply power nodes, such that charge is transferred between the first and second supply power nodes through the transistors of the charge pump and the power gate transistor.

Example 30 includes subject matter (such as a device, an electronic apparatus (e.g., circuit, electronic system, or both), or a machine) including means for performing any of the methods of examples 24-29.

The subject matter of Example 1 through Example 30 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first supply power node;
a second supply power node; and
a charge pump coupled to the first and second supply power nodes to transfer charge from the first supply power node to the second supply power node during a first time interval and to transfer charge from the second supply power node to the first supply power node during a second time interval, further comprising a transistor having a first terminal directly coupled to the first supply power node and a second terminal directly coupled to the second supply power node, wherein the transistor is arranged to turn on during the first time interval and to turn off during the second time interval.

2. The apparatus of claim 1, wherein the second supply power node is arranged to provide a supply voltage to a functional unit, and the charge pump is arranged to transfer charge from the second supply power node to the first supply power node when the functional unit changes from a higher power consumption state to a lower power consumption state.

3. The apparatus of claim 2, wherein the charge pump is arranged to transfer charge from the first supply power node to the second supply power node when the functional unit exits the lower power consumption state.

4. The apparatus of claim 1, wherein the charge pump includes a transistor to form a circuit path between the first and second supply power nodes when charge pump operation of the charge pump is disabled.

5. The apparatus of claim 1, wherein the charge pump includes stages arranged to form a ring oscillator, each of the stages being arranged to transfer charge from the first supply power node to the second supply power node during the first time interval and to transfer charge from the second supply power node to the first supply power node during the second time interval.

6. The apparatus of claim 1 further comprising:
a memory device; and
a processor coupled to the memory device, one of the memory device and the processor including:
the first supply power node;
the second supply power node; and
the charge pump coupled to the first and second supply power.

7. The system of claim 6, further comprising a display coupled to the processor.

8. The system of claim 6, further comprising an antenna coupled the processor.

* * * * *